United States Patent [19]
Rheinfelder

[11] 3,983,417
[45] Sept. 28, 1976

[54] RF LEVEL SENSING CIRCUIT

[75] Inventor: William A. Rheinfelder, Phoenix, Ariz.

[73] Assignee: Alpha Engineering Corporation, Phoenix, Ariz.

[22] Filed: Apr. 17, 1975

[21] Appl. No.: 569,107

Related U.S. Application Data

[63] Continuation-in-part of Ser. No. 553,924, Feb. 28, 1975.

[52] U.S. Cl. ............................ 307/261; 307/235 R; 307/264; 330/141
[51] Int. Cl.² ....................... H03K 5/00; H03K 1/14
[58] Field of Search ........ 307/235 A, 235 R, 235 T, 307/264, 323, 260, 261; 330/141

[56] References Cited
UNITED STATES PATENTS 3,611,164  10/1971  Day .............................. 307/235 A

*Primary Examiner*—John Zazworsky
*Attorney, Agent, or Firm*—Cahill, Sutton & Thomas

[57] ABSTRACT

An rf level sensing circuit is described incorporating a pair of oppositely poled back diodes for receiving an rf signal. The diodes are connected to the two base inputs of a differential amplifier. A voltage divider comprising three series connected resistors is connected across a voltage supply. The junction of the first two resistors is connected to one of the bases and the junction of another two of the resistors is connected to one side of one of the back diodes. The collectors of the transistors are connected to the bases of a pair of complementary transistors which in turn drive the base of an output transistor. The collector of the output transistor is connected through a conventional diode to an output terminal; a parallel network comprising a capacitor and a resistor is connected between an output terminal side diode and ground.

6 Claims, 2 Drawing Figures

RF LEVEL SENSING CIRCUIT

The present application is a continuation-in-part of my co-pending application Ser. No. 553,924 filed Feb. 28, 1975.

The present invention pertains to voltage level sensing circuits and more particularly to circuits for providing a DC output level in accordance with the changes in an rf input level over a small range of the input level.

In many applications, such as precision measuring circuits and automatic gain control circuits, circuits are required to provide a DC output level that varies in accordance with changes in rf signal levels at the input thereof; further, this requirement becomes acute when the overall rf level is small and the changes in the level are extremely small. One important application of the circuit of the present invention is in a feedback loop of an Agc system such as that shown and described in the above-identified co-pending patent application. Circuits that attempt to provide such DC output levels either cannot provide the necessary output voltage swing for control purposes in the specific application or tend to become extremely complicated, thereby suffering from high cost and decreased reliability. Effects of supply voltage changes and temperature dependent variations also impose difficultes in prior art designs.

In demanding applications such as television AGC amplifiers for use in CATV systems, the frequencies encountered range from 5 MHz to 300 MHz. In addition, the characteristic input sensitivity level of the circuit (that is, the voltage level at which the DC output level changes) must be as low as possible and preferably below 20 mV. The DC output voltage level variation should be as high as possible (in the order of 14 V or more) for as little input voltage change as possible (preferably 0.2 dB or better).

It is therefore an object of the present invention to provide an rf level sensing circuit for producing a DC output level that varies in accordance with changes in an rf input level.

It is another object of the present invention to provide an rf level sensing circuit for receiving relatively low level rf signals at the input thereof, and for providing relatively high DC voltage level changes at the output thereof for small changes in the rf input.

It is still another object of the present invention to provide an rf level sensing circuit that is substantially insensitive to power supply voltage changes.

It is yet another object of the present invention to provide an rf level sensing circuit that is relatively insensitive to temperature changes.

These and other advantages of the present invention will become apparent to those skilled in the art as the description thereof proceeds.

Briefly, in accordance with the embodiment chosen for illustration, the present invention utilizes a pair of input diodes connected in opposite polarity with each other, and each having one side thereof connected to an input terminal. The opposite sides of each of the diodes are connected to the bases of a pair of transistors connected to form a differential amplifier. A voltage divider network comprising three series connected resistors provides the middle resistor thereof in series with the base of one of the transistors and one of the diodes. The collectors of the transistors are connected through amplifiers through another diode to an output terminal.

The present invention may more readily be described by reference to the drawings in which.

Figure 1:
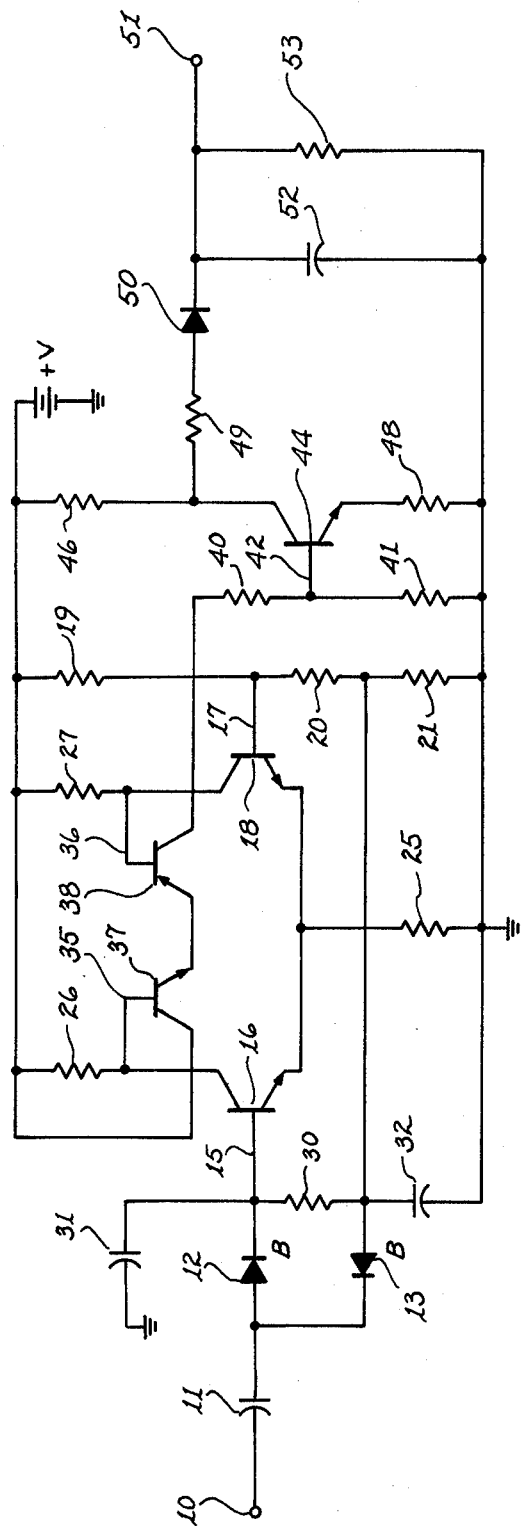
FIG. 1 is a schematic circuit diagram of an rf level sensing circuit constructed in accordance with the teachings of the present invention.

Referring now to FIG. 1, an input terminal 10 is connected through a coupling capacitor 11 to a pair of diodes 12 and 13. The diodes 12 and 13 are known as "back diodes" and are a type of tunnel diode which, when used as rectifiers, effectively have no offset and begin conduction at zero volts. Back diodes, such as those manufactured by the General Electric Company and known by the designations BD-3 and BD-4, have been found to be suitable for use in the circuit of the present invention. The diodes 12 and 13 are connected in reverse polarity with respect to each other; the opposite side of back diode 12 is connected to base 15 of transistor 16 while the opposite side of back diode 13 is connected through resistor 20 to base 17 of transistor 18.

Transistors 16 and 18 are connected in a differential amplifier configuration with their emitter-collector circuits connected in parallel and with their emitters connected to each other and to ground through a resistor 25. The collectors of transistors 16 and 18 are connected through resistors 26 and 27, respectively, to a voltage supply source.

A voltage divider comprising three series connected resistors 19, 20 and 21 is connected across the voltage supply source. A resistor 30 is connected between the diodes 12 and 13 and serves as the diode load impedance, together with the input impedance of the transistors. Capacitors 31 and 32 are connected to diodes 12 and 13, respectively.

The output from the differential amplifier comprising transistors 16 and 18 is applied to the bases 35 and 36, respectively, of transistors 37 and 38. Transistors 37 and 38 are complementary with their emitter-collector circuits connected in series through resistor 40 to base 42 of transistor 44. The emitter-collector circuit of transistor 44 is connected in series with resistors 46 and 48 across the voltage supply source. The transistor-amplifier 44 has the output at the collector thereof connected through a resistor 49 and diode 50 to an output terminal 51; a capacitor 52 and resistor 53 is connected in parallel between the output terminal side of the diode 50 and ground.

With an rf signal applied to the input terminal 10, the signal is rectified by back diodes 12 and 13 and applied to the differential amplifier comprising transistors 16 and 18.

Figure 2:
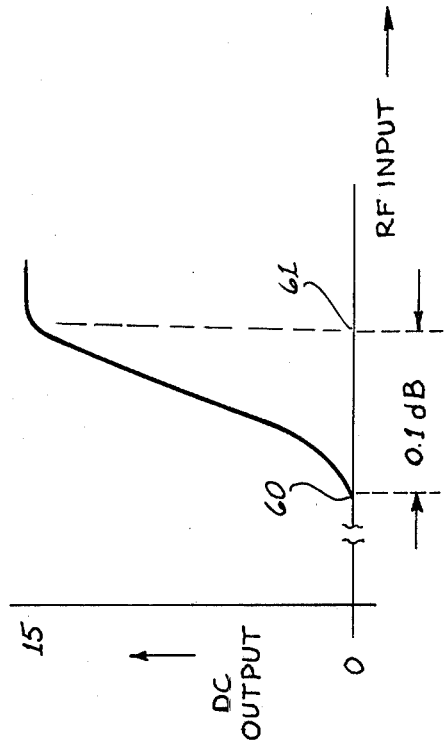
FIG. 2 is a voltage level response characteristic useful in describing the operation of the circuit of FIG. 1.

Referring to FIG. 2, the DC output level remains at zero volts until a threshold level 60 is reached. This threshold level, in the embodiment chosen for illustration, occurs in the range of 10 to 20 mV (20–26 dBmV). Between the threshold point 60 and the maximum control point 61, the DC output level will increase from zero volts to the maximum supply voltage level of 15 V. It may be noted that the total output voltage swing occurs during an rf voltage input change of only 0.1 dB. This high sensitivity to change in rf input signal level has been found to depend on the inclusion of resistor 20 in the voltage divider comprising resistors 19, 20 and 21. As may be seen from the following table of values, the value of the resistor 20 is only a small fraction of the value of resistor 19 or resistor 21; in the embodiment shown, the value of resistor 20 is 11 Ohms. While the phenomena is not completely understood, it has been found that the inclusion of this resistor in the voltage divider provides substantial independence from power supply changes and temperature-dependent variables. It is believed that inclusion of the small resistor 20 permits the back diodes 12 and 13 to operate in an area of slightly negative impedance which is responsible, at least in part, for the extreme sensitivity of the circuit. The resistor 20 also provides a slight difference in the base currents to transistors 16 and 18 of the differential amplifier to provide stability.

As stated above, it has been found that a circuit using components having the values shown below requires a resistor 20 of 11 Ohms and that stability is significantly adversely affected by increasing or decreasing the value of the resistor. Obviously, the specific value of the resistor 20 will depend on the circuit components used such as the transistors as well as the component tolerances. It has also been found that a voltage divider without the resistor 20 results in a circuit that is totally unacceptable and will not provide the required sensitivity and freedom from drift with temperature or supply voltage changes

| Element | Value |
|---|---|
| 11 | .001 mF |
| 12 | GE BD-3 |
| 13 | GE BD-3 |
| 16 | 2N 3565 |
| 18 | 2N 3565 |
| 19 | 9.1 K |
| 20 | 11 ohms |
| 21 | 4.7 K |
| 25 | 9.1 K |
| 26 | 18 K |
| 27 | 18 K |
| 30 | 100 K |
| 31 | .001 mF |
| 32 | .001 mF |
| 37 | 2N 3565 |
| 38 | 2N 4248 |
| 40 | 18 K |
| 41 | 100 K |
| 44 | 2N 3565 |
| 46 | 10 K |
| 48 | 91 ohms |
| 49 | 10 K |
| 50 | 1N 4448 |
| 52 | 5000 pF |
| 53 | 15 M |
| Supply Voltage | 15 V |

Utilizing the value of the elements as set forth above, transistors 37 and 38 are biased on when no rf signal is applied. Transistor 18 receives bias through the divider 19, 20 and 21; the base 17 of the transisor 18 is turned on relative to the base 15 of the transistor 16 by the voltage drop across resistor 20 and the drop in the back diodes 12 and 13. Therefore, transistor 16 goes toward the cut-off region with the collector connected to base 35 going high. Transistor 18 is on with the collector connected to base 36 going down. Both transistors 37 and 38 are therefore turned on, together with transistor 44.

When an rf signal is applied to terminal 10, the base 15 becomes positive with respect to base 17, thereby reversing the above-described condition. Now, transistor 16 will turn on and 18 will turn off, causing transistors 37, 38 and 44 to turn off and the output to rise.

The output diode network comprising diode 50, capacitor 52 and resistors 49 and 53 permit the DC output level to increase nearly as rapidly as it would without the network; however, the ultimate output level is retained for a period of time depending upon the value of capacitor 52 and resistor 53. The use of this output diode network renders the DC output level solely a function of the highest level rf input signal wave form. For example, in television applications, the DC output level would therefore be a function of the level of the sync pulse and prevents the DC level from varying as a result of the detection of rf levels between sync pulses which would result in erroneous AGC action.

I claim:
1. An rf level sensing circuit comprising:
   a. an input terminal and an output terminal;
   b. a back diode having one side thereof connected to said input terminal;
   c. a voltage supply source;
   d. a differential amplifier having a pair of inputs and an output and including a pair of transistors, each having their emitter-collector circuits connected in parallel, the base of each transistor forming one of said inputs, the base of one of said transistors connected to said input terminal;
   e. a voltage divider comprising first, second and third resistors connected in series across said voltage supply source;
   f. means connecting the other side of said diode to the junction of said second and third resistors;
   g. means connecting the base of the other of said transistors to the junction of said first and second resistors; and
   h. means connecting the output of said differential amplifier to said output terminal.

2. The combination set forth in claim 1, wherein said means connecting the output of said differential amplifier to said output terminal includes a network having a diode connected to said output terminal in series with the output of said differential amplifier and having a capacitor and resistor connected in parallel between the output terminal and ground.

3. An rf level sensing circuit comprising:
   a. an input terminal and an output terminal;
   b. a first and a second back diode, each having one side thereof connected to said input terminal and connected with opposite polarity with respect to each other;
   c. a voltage supply source;
   d. a differential amplifier having a pair of inputs and an output and including a pair of transistors each having their emitter-collector circuits connected in parallel, the base of each transistor forming one of said inputs;
   e. a voltage divider comprising first, second and third resistors connected in series across said voltage source;
   f. means connecting the other side of said first diode to the base of one of said transistors;
   g. means connecting the other side of said second diode to the junction of said second and third resistors;
   h. means connecting the base of the other of said transistors to the junction of said first and second resistors; and
   i. means connecting the output of said differential amplifier to said output terminal.

4. The combination set forth in claim 3, wherein said means connecting the output of said differential amplifier to said output terminal includes a network having a diode connected to said output terminal in series with said output of said differential amplifier and having a capacitor and resistor connected in parallel between the output terminal and ground.

5. The combination set forth in claim 3, wherein said means connecting the output of said differential amplifier to said output terminal includes an amplifier.

6. The combination set forth in claim 5, wherein said amplifier includes two complementary transistors having their respective bases connected to a different one of the collectors of the transistor of said differential amplifier and having their emitter-collector circuits connected in series.

* * * * *